United States Patent [19]

Riebeek

[11] Patent Number: 4,468,798

[45] Date of Patent: Aug. 28, 1984

[54] DUAL CHARGE PUMP ENVELOPE GENERATOR

[75] Inventor: Gerardus F. Riebeek, West Jordan, Utah

[73] Assignee: American Microsystems, Inc., Santa Clara, Calif.

[21] Appl. No.: 200,284

[22] Filed: Oct. 24, 1980

[51] Int. Cl.³ .................... G11C 19/28; H03K 17/687
[52] U.S. Cl. ........................................ 377/57; 377/61;
307/571; 307/490
[58] Field of Search .................. 307/221 C, 490, 571,
307/495, 227; 328/186; 377/57, 61

[56] References Cited

U.S. PATENT DOCUMENTS

| | | | |
|---|---|---|---|
| 3,621,283 | 11/1971 | Teer | 307/221 C |
| 3,922,567 | 11/1975 | Adams et al. | 307/221 C |
| 4,180,807 | 12/1979 | Eichelberger et al. | 307/221 C |

Primary Examiner—Stanley D. Miller
Assistant Examiner—B. P. Davis
Attorney, Agent, or Firm—Alan H. MacPherson; Steven F. Caserza; Richard Franklin

[57] ABSTRACT

A switched capacitor filter is designed utilizing two switched capacitor charge pumps connected in series. These two charge pumps operate with different clock frequencies thereby allowing charging of a storage capacitor at a higher frequency, thereby decreasing incremental voltage steps during the charging of the storage capacitor, resulting in the generation of a smoother exponential voltage rise.

8 Claims, 8 Drawing Figures

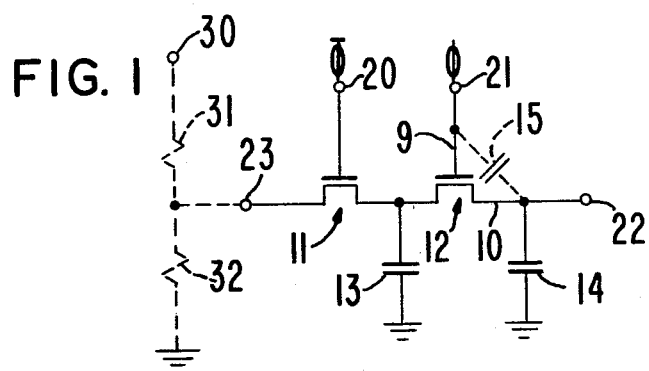
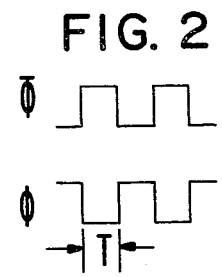

DUAL CHARGE PUMP ENVELOPE GENERATOR

BACKGROUND OF THE INVENTION

1. Field of the Invention

This invention relates to switched capacitor filters, and more specifically to switched capacitor filters useful in the generation of exponential envelope voltages used, for example, in electronic organs.

2. Description of the Prior Art

Prior art methods of generating exponential envelope voltages for use in electronic organs are well known. The circuit as shown in FIG. 1 is commonly used for this purpose (see, for example, the article by David L. Fried entitled "Analog Sample-Data Filters" published on pages 302 to 304 of the IEEE Journal of Solid-State Circuits in August 1972). In the circuit of FIG. 1, a reference voltage ($V_{REF}$) is applied at node 23. This reference voltage may be obtained by any well known means, the simplest of which is a voltage divider consisting of resistors 31 and 32 connected between a source of potential at node 30 and ground as shown in FIG. 1. The two nonoverlapping clock signals required to operate the circuit of FIG. 1 are shown in FIG. 2, and are labeled $\phi$ and $\bar{\phi}$. The switches used in the circuit of FIG. 1 are shown to be MOSFET transistors 11 and 12; however, any suitable switch means may be used. In the operation of the circuit of FIG. 1, initially the voltages appearing on capacitors 13 and 14 are zero. During the first half clock period when $\bar{\phi}$ is high, switch 11 is turned on and capacitor 13 (having a capacitance value $C_1$) is charged through switch 11 to $V_{ref}$ as applied to node 23. The amount of charge stored on capacitor 13 is simply $C_1 \cdot V_{REF}$. During the second half of the first clock period, $\phi$ is high, and $\bar{\phi}$ is low. This causes switch 11 to turn off and switch 12 to turn on. Thus the charge previously stored on capacitor 13 is shared with capacitor 14 (having capacitance value $C_2$) through the path provided by the open switch 12. The resulting voltage across capacitor 14 is thus $Q/(C_1+C_2)$ or $[C_1/(C_1+C_2)]V_{REF} \cdot \phi$ then goes low, and $\bar{\phi}$ goes high. During the first half of the second clock period, capacitor 13 is again charged to $V_{REF}$ through switch 11. During the second half of the second clock period $\bar{\phi}$ goes low and $\phi$ goes high thus causing the charge stored on capacitor 13 to again be shared with capacitor 14. Thus the voltage on capacitor 14 becomes $$\left[ \frac{C_1}{C_1 + C_2} + \frac{C_1 C_2}{(C_1 + C_2)^2} \right] V_{REF}.$$

A graphical representation of the voltage available at node 22 with respect to time is shown in FIG. 3. Note that the initial step is rather large, and subsequent steps occurring during subsequent clock cycles become smaller and smaller, thus resulting in an approximately exponential voltage rise on node 22.

An RC circuit equivalent to the circuit of FIG. 1 is shown in FIG. 4. With a reference voltage applied to terminal 23, capacitor 14 will charge through resistor 45 resulting in a voltage varying exponentially with time appearing on terminal 22. The circuit of FIG. 1 will approximate this RC circuit with resistor equivalent capacitor 13. The time constant of the circuit of FIG. 1 will be equal to $tC_2/C_1$ where t is the period of clock pulses $\phi$ and $\bar{\phi}$. Thus, the time constant of a switched capacitor equivalent circuit may be changed simply by changing the period of $\phi$ and $\bar{\phi}$. Furthermore, in MOS integrated circuits, resistance values are not highly controllable due to process limitations, while capacitance ratios are highly controllable, because capacitor size is quite controllable, and dielectric thickness is quite uniform across each semiconductor die. The high resistor values required to generate slow exponential voltages would also consume too much space on a semiconductor die to be practical. For these reasons, switched capacitor "resistor-equivalent" circuits are favored over simple RC circuits in MOS applications.

One disadvantage in the prior art circuit of FIG. 1 is due to the parasitic capacitance inherent in MOSFET transistors. Such a parasitic capacitor is shown in dashed lines in FIG. 1 as capacitor 15 appearing between gate 9 and drain 10 of MOSFET 12. This causes the output voltage stored on capacitor 14 and available on node 22 to be degraded due to charge sharing with capacitor 15. Thus, after the first clock period, when $\phi$ goes low and switch 12 turns off, the actual voltage available on capacitor 14 will be approximately equal to $$\frac{C_1 C_2}{(C_1 + C_2)(C_2 + C_3)} V_{REF}$$

where $C_3$ is the capacitance value of parasitic capacitor 15. This voltage degradation is referred to as "pickoff". Pickoff generates a noise component seen across capacitor 14 and appearing on node 22. The frequency of pickoff is equal to the sampling frequency, $f_\phi$.

SUMMARY OF THE INVENTION

This invention utilizes two switched capacitor charge pumps in series operating at different clock frequencies. This results in an increase of the output voltage step frequency, thus resulting in a smoother exponential voltage generation. Thus the output voltage filtering requirements are less stringent than for prior art circuits. The higher sampling frequency of the circuit of this invention also reduces the possibility of noise effects on the output signal due to a decrease in magnitude of output voltage steps. If the input signal to the filter of this circuit is an A.C. signal, effects on the output signal due to aliasing are reduced, due to the higher sampling frequency. This invention also provides a circuit with lower power dissipation than prior art circuits. Finally pickoff is eliminated with the circuit of this invention by eliminating the change in output voltage due to parasitic capacitance as each clock switches between logic states.

BRIEF DESCRIPTION OF THE DRAWINGS

FIG. 1 is a schematic diagram of a prior art single channel digitally switched capacitor filter.

FIG. 2 is a drawing of the clock pulses required to operate the circuit of FIG. 1.

FIG. 3 is a graphical representation of the voltage on the storage capacitor 14 of FIG. 1 with respect to time.

FIG. 4 is an RC circuit equivalent to the switched capacitor filter circuit of FIG. 1.

FIG. 5 is a schematic diagram of one embodiment the dual charge pump circuit of this invention.

DETAILED DESCRIPTION OF THE INVENTION

Figure 6:
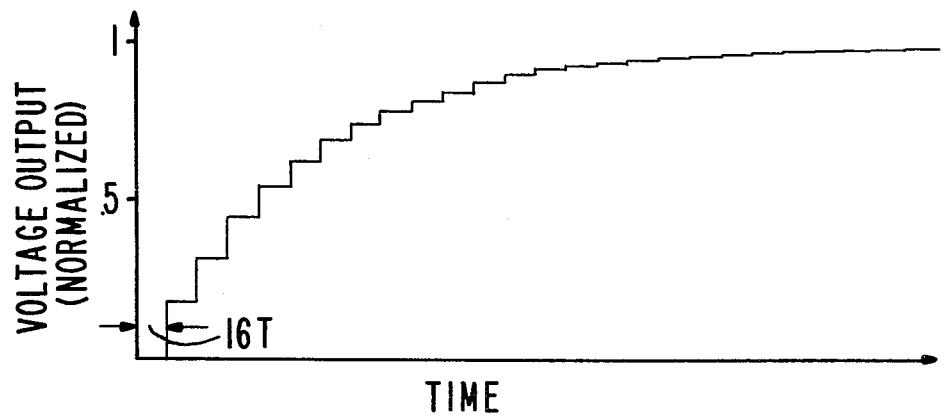
FIG. 6 is a graphical representation of the voltage stored on the storage capacitor 12 of the circuit of FIG. 5 with respect to time.

FIG. 5 shows a detailed schematic diagram of a dual charge pump envelope generator constructed in accordance with this invention. A voltage divider comprised of resistors 31 and 32 is again shown to be a source of a reference voltage of $V_{REF}$ applied to node 23. Of course this reference voltage may be generated by any desired method. MOS transistor switches 9 and 10, and capacitors 13 and 14 comprise a circuit identical to the prior art circuit of FIG. 1. However, connected in series with this circuit, between input node 23 and MOS transistor switch 9, is a second switched capacitor charge pump circuit comprised of MOS transistor switches 7 and 8, and storage capacitors 11 and 12. Frequency divider 6 (of a type well-known in the art) is used to cause MOS transistors 7 and 8 to operate at a frequency equal to the frequency of $\phi$ and $\bar{\phi}$ of the prior art circuit of FIG. 1, which is less than the frequency of operation of MOS transistor switches 9 and 10. Thus, if frequency divider 6 is a divide by 8 counter, MOS transistor switches 7 and 8 will operate at frequencies $F_7 = F_8 = (\frac{1}{8}) F_9 = (\frac{1}{8}) F_{10}$, where $F_7$, $F_8$, $F_9$, and $F_{10}$ are the frequencies of operation of MOS switches 7, 8, 9, and 10, respectively. Of course, the divide ratio of frequency divider 6 may be set at any desired number, thus allowing the characteristics of the circuit to be specifically selected to be most beneficial for the particular use for which the circuit of this invention will be utilized.

In the operation of the circuit of FIG. 5, voltages on capacitors 11, 12, 13, and 14 are initially all equal to zero. During the first half-clock period, $\bar{\phi}$ is high and $\phi$ is low. With a high applied to node 20 from $\bar{\phi}$, and thus to gate 90 of MOSFET via frequency divider 6, MOSFET switch 7 is turned on, thus causing capacitor 11 to be charged to $V_{REF}$. At the same time, a high on node 20 from $\phi$ causes MOSFET switch 9 to turn on. However, since the voltage stored on capacitor 12 at this time is equal to zero, no charge transfer occurs through MOSFET switch 9. During the second half of the first clock period, $\phi$ is high and $\bar{\phi}$ is low. Thus, switches 7 and 9 turn off. With the high connected to node 21 from $\phi$, MOSFET switch 8 is turned on, thus causing the charge stored on capacitor 11 to be shared with capacitor 12, as in the prior art circuit of FIG. 1. With a high connected to node 21 from $\phi$, MOSFET switch 10 is also turned on. However, since at this time the charge stored on capacitor 13 is equal to zero, no charge transfer takes place due to MOSFET switch 10 being turned on.

During the first half of the second clock period, $\bar{\phi}$ is high, and $\phi$ is low. Thus, switches 8 and 10 turn off. Because frequency divider 6 is a divide by 8 counter, the high applied to node 20 from a $\bar{\phi}$ will not be applied to MOSFET switch 7. The high applied to node 20 from $\bar{\phi}$ will be applied to MOSFET switch 9, thus causing it to turn on. With MOSFET switch 9 turned on, the charge stored on capacitor 12 will be shared with capacitor 13. During the second half of the second clock period, $\bar{\phi}$ is low and $\phi$ is high. Again, since frequency divider 6 is a divide by 8 counter, the high applied to node 21 from $\phi$ will not be applied to MOS-FET switch 8. The high applied to node 21 from $\phi$ will be applied to MOSFET switch 10, thus causing it to turn on. This, in turn, causes the charge stored on capacitor 13 to be shared with output storage capacitor 14, and a first increase in output voltage is applied to output terminal 22.

During the third through eighth clock periods, MOSFET switches 9 and 10 will alternately be turned on and off, thus causing sharing of the charge stored on capacitor 12 with capacitor 13 during each first half cycle, and charge storing between capacitor 13 and 14 during each second half cycle.

During the first half of the 9th cycle, $\bar{\phi}$ will be high and $\phi$ will be low. The high from $\bar{\phi}$ will be applied to MOSFET switch 7, thus causing capacitor 11 to again be charged to $V_{REF}$. The high from $\bar{\phi}$ will also be applied to MOSFET switch 9, again causing charge sharing between capacitor 12 and capacitor 13. During the second half of the 17th cycle, $\bar{\phi}$ will be low and $\phi$ will be high. The high from $\phi$ will be applied to MOSFET switch 8, again causing the charge stored on capacitor 11 to be shared with capacitor 12. At the same time, the high from $\phi$ will be applied to MOSFET switch 10, again causing a sharing of charge between capacitor 13 and output capacitor 14. This process can continue for thousands of cycles, thus resulting in an exponential rise in the voltage stored on output storage capacitor 14 and available at output terminal 22.

Figure 7:
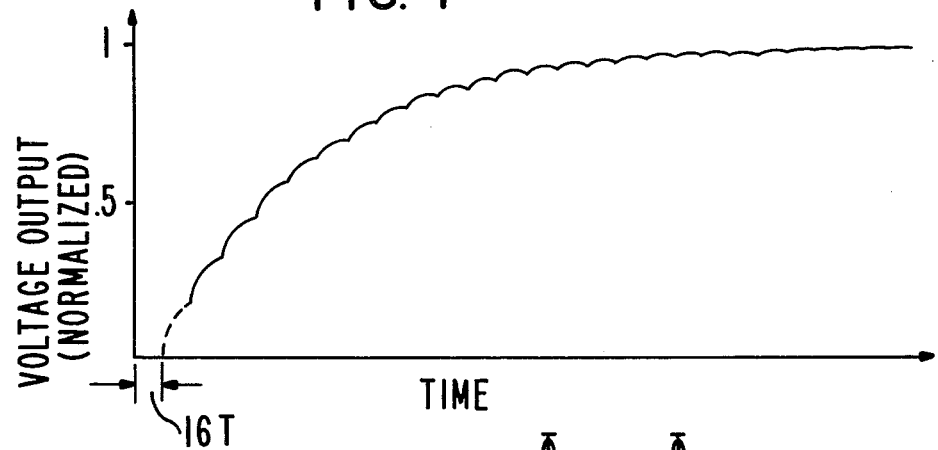
FIG. 7 is a graphical representation of the voltage stored on the storage capacitor 14 of the circuit of FIG. 5 with respect to time.

FIG. 6 shows graphically a representation of the voltage stored on capacitor 12 with respect to time in the case where divider 6 is a divide by eight circuit. Of importance, each incremental step in the magnitude of the voltage stored on capacitor 12 occurs after each 8th cycle of clock pulses $\phi$ and $\bar{\phi}$. FIG. 7 shows the graphical representation of the magnitude of the output voltage available on terminal 22 with respect to time. Notice that corresponding to each voltage step in FIG. 6 is a "scalloped" voltage step in FIG. 7, which is comprised of eight smaller incremental steps. The output voltage at terminal 22 contains eight times as many steps as the voltage on capacitor 12, each of a smaller incremental increase, due to the fact that the second stage of the dual charge pump envelope generator of FIG. 5, comprised of MOSFET switches 9 and 10, is operating at a frequency of eight times the frequency of operation of the first stage, comprised of MOSFET transistor switches 7 and 8. Thus, the output voltage available from output capacitor 14 through output terminal 22 will be much smoother than the output voltage from prior art systems, while maintaining the same general exponential waveform shape. This reduces the filtering requirements of the circuit of this invention over the prior art circuit of FIG. 1. With a charge pump frequency of capacitor 14 essentially increased by a factor of 8, the possibility of aliasing is also reduced over prior art circuits, if an AC signal is used as the input signal applied to input terminal 23.

Figure 8:
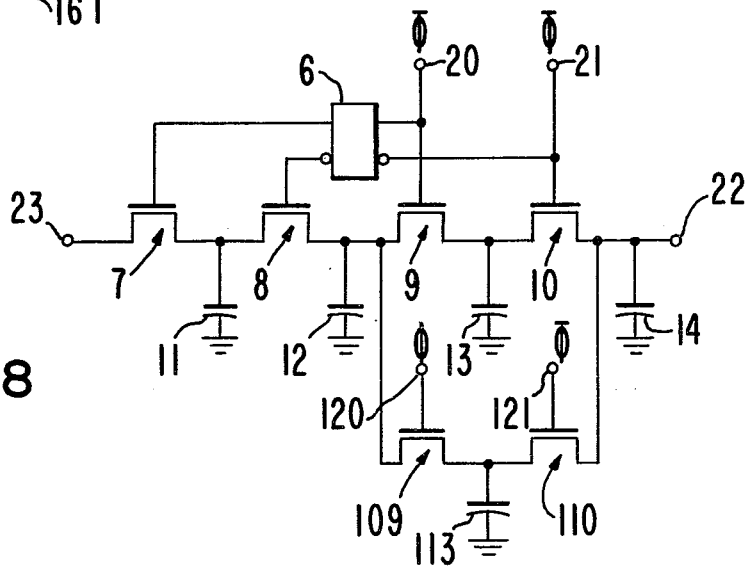
FIG. 8 is a schematic diagram of a second embodiment of the dual charge pump circuit of this invention.

FIG. 8 is a schematic diagram of a second embodiment of the dual charge pump circuit of this invention, which incorporates in the second stage a modified structure to provide a smoother output voltage. This structure is described in U.S. patent application Ser. No. 06/189,709 filed Sept. 22, 1980 now U.S. Pat. No. 4,344,050, which is assigned to the assignee of this invention. Essentially, the circuit of FIG. 8 utilizes a second switched capacitor charge pump, operating in parallel with the second stage formed by MOSFET switches 9 and 10. During each first half cycle, $\bar{\phi}$ is high and φ is low. This causes MOSFET switch 9 to turn on, thus sharing the charge stored on capacitor 12 with capacitor 13. With $\bar{\phi}$ high, MOSFET switch 110 also turns on, thus causing the charge stored in capacitor 113 to be shared with output capacitor 14, thereby causing an increase in the output voltage available on terminal 22. During each second half cycle, φ is high and $\bar{\phi}$ is low. With a high from φ applied to terminal 120, MOSFET switch 109 conducts, thus causing the charge stored in capacitor 12 to be shared with capacitor 113. At the same time, a high from φ is applied to terminal 21, thus causing MOSFET switch 10 to conduct, thus causing the charge stored on capacitor 13 to be shared with output capacitor 14, again causing an increase in the output voltage available at output terminal 22. Thus, in the circuit of FIG. 8, two steps are generated in the output voltage stored on capacitor 14 for each clock cycle. This causes the output step frequency to double over the output step frequency of the circuit of FIG. 5, thus resulting in a smoother output voltage generated. Capacitors 13 and 113 of FIG. 8, if constructed to each be equal to ½ the capacitance value of capacitor 13 of FIG. 5, will cause the general shape of the output wave form generated on terminal 22 of FIG. 8 to be the same as the output wave form generated on terminal 22 of FIG. 5. Thus the circuit of FIG. 8 results in an output step frequency of 16 times greater that output step frequency of the prior art circuit of FIG. 1. This increased output frequency results in a much smoother output voltage being generated, thus minimizing the requirements for filtering of the output voltage. Furthermore, with output steps being generated at a frequency of 16 times that of the prior art circuit of FIG. 1, the effects of aliasing are greatly reduced if an AC signal is used as $V_{REF}$. Aliasing is the inclusion within the passband, of an unwanted signal having a frequency greater than the clock frequency of the circuit, due to the chopping action of the switched capacitor circuit.

Persons skilled in the design and fabrication of semiconductor integrated circuits are capable of implementing the circuit of this invention in the form of integrated circuits, utilizing standard design and processing techniques. Construction of the circuit of this invention as a semiconductor integrated circuit is the preferred embodiment, due to the resulting small size, low power requirements and cost savings obtained.

I claim:

1. A dual charge pump envelope generator comprising:

an input terminal for receiving a reference voltage;
an output terminal for supplying an output voltage;
a first output storage capacitor having a first plate connected to ground, and a second plate;
a first switched capacitor resistor-equivalent circuit having an input lead and an output lead, said input lead being connected to said input terminal and said output lead being connected to said second plate of said first output storage capacitor, said first switched capacitor resistor equivalent circuit including a first intermediate storage capacitor having a first plate, and a second plate connected to ground, a first switch means controlled by one clock pulse and a first pair of non-overlapping clock pulses, said first switch means connected between said first switched capacitor resistor equivalent circuit input lead and said first plate of said first intermediate storage capacitor, and a second switch means controlled by a second clock pulse of said first pair of non-overlapping clock pulses connected between said first plate and said first intermediate storage capacitor and said output lead of said first switched capacitor resistor equivalent circuit;
a second output storage capacitor having a first plate connected to said output lead and a second plate connected to ground; and
a second switched capacitor resistor-equivalent circuit having an input lead connected to said second plate of said first output storage capacitor and an output lead connected to said first plate of said second output storage capacitor, said second switched capacitor resistor equivalent circuit including a second intermediate storage capacitor having a first plate, and a second plate connected to ground, a third switch means controlled by one clock pulse of a second pair of non-overlapping clock pulses connected between said second switched capacitor resistor equivalent circuit input lead and said first plate of said second intermediate storage capacitor, and a fourth switch means controlled by said second clock pulse of said second pair of non-overlapping clock pulses connected between said first plate of said second intermediate storage capacitor and said output lead of said second switched capacitor resistor equivalent circuit;
wherein said second pair of non-overlapping clock pulses have a frequency n times the frequency of said first pair of non-overlapping clock pulses, where n is a selected integer.

2. A dual charge pump envelope generator comprised of:

an input terminal for receiving a reference voltage;
an output terminal;
a first output storage capacitor having a first plate connected to ground, and a second plate;
a first switched capacitor resistor equivalent having an input terminal and an output terminal, said first switched capacitor resistor equivalent input terminal being connected to said input terminal and said first switched capacitor resistor equivalent output terminal being connected to said second plate of said first output storage capacitor;
a second output storage capacitor having a first plate connected to said output terminal and a second plate connected to ground;
a second switched capacitor resistor-equivalent circuit having an input terminal connected to said second plate and said first output storage capacitor and an output terminal connected to said first plate of said second output storage capacitor; and
a third switched capacitor resistor-equivalent circuit having an input terminal connected to said second plate of said first output storage capacitor and an output terminal connected to said first plate of said second output storage capacitor.

3. Structure as in claim 2 wherein each of said switched capacitor resistor-equivalent circuits comprise:

a first switch means connected between said switched capacitor resistor equivalent input terminal and a first plate of an intermediate storage capacitor having two plates, said other plate being connected to ground;
a second switch means connected between said first plate of said intermediate storage capacitor and said outut terminal of said switched capacitor resistor equivalent.

4. Structure as in claim 3 wherein said first switch means of said first switched capacitor resistor equivalent is controlled by one clock pulse of a first pair of non-overlapping clock pulses, said second switch means of said first switched capacitor resistor equivalent is controlled by said second clock pulse of said first pair of non-overlapping clock pulses, said first switch means of said second switched capacitor resistor equivalent and said second switch means of said third switched capacitor resistor equivalent are controlled by said first clock pulse of said second pair of non-overlapping clock pulses and said second switch means of said second switched capacitor resistor equivalent and said first switch means of said third switched capacitor resistor equivalent are controlled by said second clock pulse of said second pair of non-overlapping clock pulses.

5. Structure as in claim 4 wherein
said first pair of clock pulses has a frequency lower than the frequency of said second pair of clock pulses.

6. Structure as in claim 5 wherein the ratio of said second pair of clock pulses to said first pair of clock pulses is an integral number.

7. Structure as in claim 6 wherein said ratio is 5.

8. Structure as in claims 1, 2, 3, 4, 5, 6 or 7 wherein said switch means comprise MOS field effect transistors.

* * * * *

UNITED STATES PATENT AND TRADEMARK OFFICE
CERTIFICATE OF CORRECTION

PATENT NO. : 4,468,798

DATED : August 28, 1984

INVENTOR(S) : Gerardus F. Riebeek

It is certified that error appears in the above—identified patent and that said Letters Patent is hereby corrected as shown below:

Figure 8, Sheet 2 of 2: Above node 21, delete "$\bar{\emptyset}$" and insert --$\emptyset$--.

Column 1, line 41: The sentence should terminate after "$V_{REF}$" with a period. After a space, the next sentence should begin with "$\emptyset$ then goes". The current line appears to multiply "$V_{REF}$" and "$\emptyset$" within a single broken sentence.

Column 3, line 13: Insert a space between "$V_{REF}$" and "applied".

Column 5, line 63. Delete "and" and insert --of--.

UNITED STATES PATENT AND TRADEMARK OFFICE
CERTIFICATE OF CORRECTION

PATENT NO. : 4,468,798
DATED : August 28, 1984
INVENTOR(S) : Gerardus F. Riebeek It is certified that error appears in the above—identified patent and that said Letters Patent is hereby corrected as shown below:

Column 6, line 2: Delete "and" and insert --of--.

Column 8, line 11: Delete "5" and insert --8--.

Signed and Sealed this

Twenty-sixth Day of March 1985

[SEAL]

Attest:

DONALD J. QUIGG

*Attesting Officer*  *Acting Commissioner of Patents and Trademarks*